United States Patent
Li et al.

(10) Patent No.: US 9,239,523 B2
(45) Date of Patent: Jan. 19, 2016

(54) DIFFRACTION BASED OVERLAY LINEARITY TESTING

(75) Inventors: Jie Li, Milpitas, CA (US); Zhuan Liu, Fremont, CA (US); Silvio J. Rabello, Palo Alto, CA (US); Nigel P. Smith, Hillsboro, CA (US)

(73) Assignee: Nanometrics Incorporated, Milpitas, CA (US)

( * ) Notice: Subject to any disclaimer, the term of this patent is extended or adjusted under 35 U.S.C. 154(b) by 487 days.

(21) Appl. No.: 13/053,584

(22) Filed: Mar. 22, 2011

(65) Prior Publication Data

US 2011/0238365 A1    Sep. 29, 2011

Related U.S. Application Data

(60) Provisional application No. 61/317,689, filed on Mar. 25, 2010.

(51) Int. Cl.
*G03F 7/20* (2006.01)

(52) U.S. Cl.
CPC .................................. *G03F 7/70633* (2013.01)

(58) Field of Classification Search
CPC .................................................. G03F 7/70633
USPC .......................................... 702/150; 356/401
See application file for complete search history.

(56) References Cited

U.S. PATENT DOCUMENTS

| | | | |
|---|---|---|---|
| 6,982,793 B1* | 1/2006 | Yang et al. | 356/401 |
| 7,230,705 B1 | 6/2007 | Yang et al. | |
| 7,666,559 B2* | 2/2010 | Schulz | 430/22 |
| 2004/0233440 A1* | 11/2004 | Mieher et al. | 356/401 |
| 2005/0018190 A1* | 1/2005 | Sezginer et al. | 356/401 |
| 2009/0087756 A1 | 4/2009 | Schulz | |
| 2011/0134419 A1* | 6/2011 | Fuchs et al. | 356/237.5 |

OTHER PUBLICATIONS

International Search Report and Written Opinion mailed on May 20, 2011 for International Application No. PCT/US2011/029381 filed on Mar. 22, 2011, 8 pages.

* cited by examiner

*Primary Examiner* — Alexander Satanovsky
(74) *Attorney, Agent, or Firm* — Silicon Valley Patent Group LLP

(57) ABSTRACT

An empirical diffraction based overlay (eDBO) measurement of an overlay error is produced using diffraction signals from a plurality of diffraction based alignment pads from an alignment target. The linearity of the overlay error is tested using the same diffraction signals or a different set of diffraction signals from diffraction based alignment pads. Wavelengths that do not have a linear response to overlay error may be excluded from the measurement error.

20 Claims, 3 Drawing Sheets

DIFFRACTION BASED OVERLAY
LINEARITY TESTING

CROSS REFERENCE TO RELATED
APPLICATIONS

This application claims the benefit of Provisional Application No. 61/317,689, filed Mar. 25, 2010, which is incorporated by reference herein in its entirety.

BACKGROUND

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. Typically, the photomask has alignment targets or keys that are aligned to fiduciary marks formed in the previous layer on the substrate. However, as the size of integrated circuit features continues to decrease, it becomes increasingly difficult to measure the overlay accuracy of one masking level with respect to the previous level. This overlay metrology problem becomes particularly difficult at submicrometer feature sizes where overlay alignment tolerances are reduced to provide reliable semiconductor devices. One type of overlay measurement is known as diffraction based overlay metrology.

SUMMARY

An empirical diffraction based overlay (eDBO) measurement of an overlay error is produced using diffraction signals from a plurality of diffraction based alignment pads from an alignment target. The linearity of the overlay error is tested using the same diffraction signals or a different set of diffraction signals from diffraction based alignment pads. Wavelengths that do not have a linear response to overlay error may be excluded from the measurement error.

DETAILED DESCRIPTION

Figure 1A:
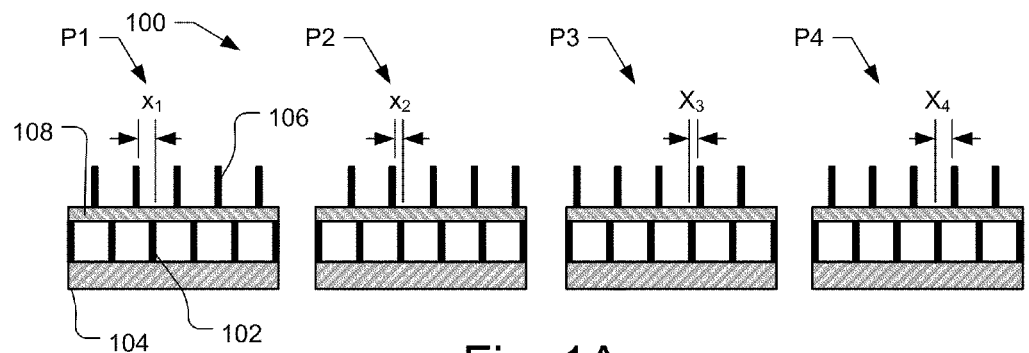
FIG. 1A illustrates a DBO target including a number of alignment pads with top diffraction gratings that are on top of bottom diffraction gratings.
Figure 1B:
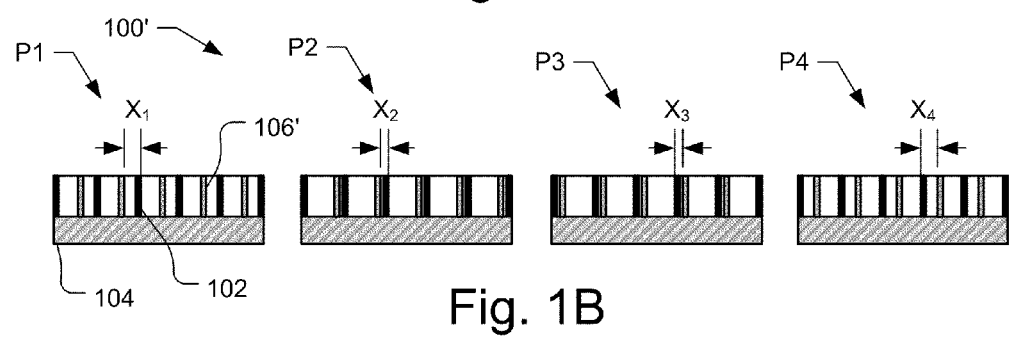
FIG. 1B illustrates a DBO target including a number of alignment pads with top diffraction gratings and bottom diffraction gratings that are on the same layer.

Diffraction based overlay (DBO) metrology is based on the measurement of the diffraction of light from a number of alignment pads. FIG. 1A, by way of example, illustrates a DBO target 100 including a number of alignment pads P1, P2, P3, and P4, each with a bottom diffraction grating 102 on a base layer 104 and a top diffraction grating 106 on a top layer 108. In some cases, as illustrated by DBO target 100' in FIG. 1B, the top diffraction gratings 106' may be on the same layer as the bottom diffraction gratings 102. Thus, while each alignment pad includes at least two overlying gratings produced in separate operations, the gratings may be separated from each other by one or more layers, as illustrated in FIG. 1A, or on the same layer, as illustrated in FIG. 1B. Moreover, DBO targets may have fewer or additional alignment pads than illustrated in FIGS. 1A and 1B. Further, more than two diffraction gratings may be present in each alignment pad.

Figure 1C:
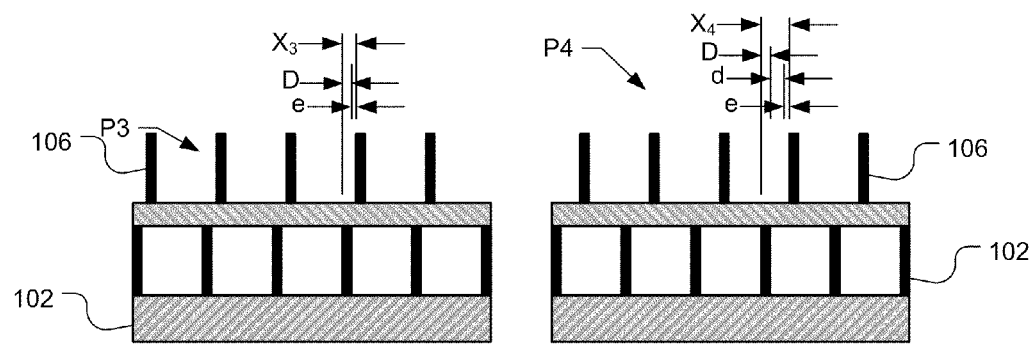
FIG. 1C illustrates pre-programmed shifts in two alignment pads.

An error in the alignment of the top diffraction grating with respect to the bottom diffraction grating of a DBO target 100 produces change in the resulting diffracted light with respect to perfectly aligned top and bottom diffraction gratings. Using a number of alignment pads and comparing the resulting diffraction signal from each alignment pad, the overlay error can be determined, which is referred to as empirical DBO (eDBO) measurement. In eDBO measurements, the DBO target 100 includes a pre-programmed shift between two or more of the alignment pads. The pre-programmed shift is an intentional shift from perfect alignment of the top and bottom gratings. By way of example, FIG. 1C illustrates pre-programmed shifts in the alignment pads P3 and P4. As illustrated, alignment pads P3 and P4 both have a pre-programmed shift D (D>0) between the top grating 106 and the bottom grating 102, which is approximately 25% of the grating pitch. The alignment pad P4 includes an additional pre-programmed shift d (d>0, d<<D), which is sometimes referred to as a reference shift, so that alignment pad P4 and alignment pad P3 differ in only the pre-programmed shift, d. Both alignment pads P3 and P4 are also illustrated as being shifted by the overlay error e so that alignment pad P3 has a total shift $x_3=D+e$ and alignment pad P4 has a total shift $x_4=D+d+e$. It should be understood that while the shift D and the reference shift d are illustrated in FIG. 1C as being in the same direction, either or both of the shift D and the reference shift d may be in the opposite direction if desired, e.g., −D and/or −d. Moreover, the same or different reference shifts may be used for different alignment pads, e.g., alignment pads P1 and P2. Additionally, if desired, all alignment pads P1, P2, P3, and P4 may include a reference shift.

The eDBO measurement is at least partially based on an assumption that the resulting diffraction signal has a linear response to the overlay error for different wavelengths over the measured overlay shift. Thus, with two alignment pads P3 and P4 differing in only a pre-programmed shift, d, the signal difference resulting between alignment pads P3 and P4 may be used to convert the difference in signal between pads P2 and P3 into an overlay result, e, provided the assumption of linearity is valid.

Thus, it is desired to modify the eDBO metrology to permit testing of the linearity assumption as a function of wavelength, which may be used, for example, to allow automatic wavelength range selection.

Pads use a base layer 104 to top layer 108 shift D>0, which is approximately 25% of the grating pitch. Reference pads use an additional shift d>0, d<<D. Overlay error e is unknown and can be positive or negative. Grating pitch P is in the range of 200 to 2000 nm, so that D is in the range 50 to 500 nm. The key assumptions behind eDBO are that the signal S for total grating shift x obeys $$S(x)=S(-x) \qquad \text{eq. 1}$$

and that e and d are in a range such that $$S(D+e)=(1+ke)S(D) \qquad \text{eq. 2}$$

$$S(D+d+e)=(1+k(e+d))S(D) \qquad \text{eq. 3}$$

$$S(-D+e)=(1-ke)S(D) \qquad \text{eq. 4}$$

where k is a scaling factor that is constant for shift but can vary by wavelength λ.

An eDBO target uses a minimum of three alignment pads per axis, but four alignment pads are commonly used. The fourth alignment pad, e.g., P4 in FIG. 1A, can be used to test the linearity assumption using pairs of alignment pads that differ only by a known amount in the total shift x, e.g., alignment pads P1 and P2 form one pair, and alignment pads P3 and P4 form another pair. Different values of the reference shift d may be used in each pair of alignment pads to improve confidence. It should be understood that the additional shift may vary for different alignment pads, i.e., $d_1$, $d_2$ may be used, where $d_2$ is different from $d_1$. In some embodiments, $d_2$ may be $2d_1$ or some other integer multiple of $d_1$, but non-integer multiples may be used if desired. As discussed above, there may be more than or fewer than four alignment pads.

Alignment pads with opposite values of D and D>>d, D>>|e| with the assumption S(x)=S(−x) are used. Linearity will be defined as a dimensionless number, L, with L=0 indicating perfect linearity. L is a function of wavelength (λ).

The linearity test tests the assumption that the signal S(x) is proportional to grating shift x only within a range $[x_a, x_b]$, where $x_a$ and $x_b$ are the minimum and maximum shifts for the pads used to make the test. It is desirable that the signal data used for the overlay error measurement are obtained from pads $P_i$ with shifts $x_i$ that are within the interval $[x_a, x_b]$. As long as S(x)=S(−x), then the shifts x can be reflected about x=0 when testing the range conditions.

If four pads are used in the linearity test, then this condition reduces to one that the interval [x1,x2] for pads P1 to P2, when reflected about x=0, overlaps the interval [x3,x4] between pads P3 and P4. That is:

$$x_3 \le -x_1 \le x_4 \qquad \text{eq. 5}$$

or $$x_3 \le -x_2 \le x_4 \qquad \text{eq. 6}$$

If three alignment pads (e.g. P1, P2 and P3, all with x>0) are used to check linearity, with the fourth alignment pad (with x<0) being used only for overlay measurement, then x is necessarily continuous in the linearity check because one of the points is shared (e.g. offset ranges $x_1$ to $x_2$ and $x_2$ to $x_3$ share $x_2$), and the condition is that the offset of the fourth point reflected through x=0 ($-x_4$) lies within the range of x of the three alignment pads used in the linearity check.

$$\min(x_1, x_2, x_3) \le -x_4 \le \max(x_1, x_2, x_3) \qquad \text{eq. 7}$$

On this basis, the range of e can be calculated as a function of d for which linearity can be known. The linearity check also provides some detection of d or D varying from pad to pad. When a test for linearity is successful, it is desirable to ensure that the data used for the overlay measurement was obtained for x within the wavelength range shown to have a linear response.

Generalized Derivation Of Linearity

Linearity may be derived as follows. Define the true signal S(x) as the sum of an even function A(x) and odd function B(x):

$$S(x)=A(x)+B(x) \qquad \text{eq. 8}$$

$$A(-x)=A(x) \qquad \text{eq. 9}$$

$$B(-x)=-B(x) \qquad \text{eq. 10}$$

The function A(s) may be expanded as follows:

$$A(x+d)=A(x)(1+kd)+\alpha(x+d) \qquad \text{eq. 11}$$

Using the following examples of $x_i$:

$$x1=-D-d1+e \qquad \text{eq. 12}$$

$$x2=-D+e \qquad \text{eq. 13}$$

$$x3=D+e \qquad \text{eq. 14}$$

$$x4=D+d2+e \qquad \text{eq. 15}$$

the corresponding signals are as follows:

$$S1=A(D)(1+kd_1-ke)-B(D+d_1-e)+\alpha(-D-d_1+e) \qquad \text{eq. 16}$$

$$S2=A(D)(1-ke)-B(D-e)+\alpha(-D+e) \qquad \text{eq. 17}$$

$$S3=A(D)(1+ke)+B(D+e)+\alpha(D+e) \qquad \text{eq. 18}$$

$$S4=A(D)(1+kd_2+ke)+B(D+d_2-e)+\alpha(D+d_2+e) \qquad \text{eq. 19}$$

Using the following shorthand:

$$\alpha_i=\alpha(x_i) \qquad \text{eq. 20}$$

$$B_i=B(x_i) \qquad \text{eq. 21}$$

Linearization may be constructed as follows:

$$L = \left(\frac{d_2}{d_1}\right)\left(\frac{S_1 - S_2}{S_4 - S_3}\right) - 1 \qquad \text{eq. 22}$$
$$= \left(\frac{d_2}{d_1}\right)\left(\frac{A(D)kd_1 + \alpha_1 - \alpha_2 + B_1 - B_2}{A(D)kd_2 + \alpha_4 - \alpha_3 + B_4 - B_3}\right) - 1$$

If all the assumptions hold true, then α(x)=0 and B(x)=0 and L=0. The linearity L is non zero if the assumptions are incorrect, and hence the value of L may be used to improve the validity of the eDBO measurement based on these assumptions by accepting only data for which |L| is less than a threshold value. If $d_1=d_2$ then L will also be zero if $\alpha_1-\alpha_2+B_1-B_2=\alpha_4-\alpha_3+B_4-B_3$. Although this is unlikely, using $d_1 \ne d_2$ slightly improves the test. As can be seen from equation 22, the linearity L not only tests for linearity of the signal (α(x)=0), but also tests that the signal is symmetric (B(x)=0).

eDBO Target A

In one embodiment of the eDBO target 100 (or eDBO target 100'), the alignment pads (P1, P2, P3, P4) include the following respective shifts: $x_1=-D-d+e$; $x_2=-D+e$; $x_3=+D+e$; $x_4=+D+d+e$. The resulting signals $S_i(x_i)$ from each alignment pad $P_i$ are functions as follows:

$$S_1=S(-D-d+e)=S(D+d-e) \qquad \text{eq. 23}$$

$$S_2=S(-D+e)=S(D-e) \qquad \text{eq. 24}$$

$$S_3=S(D+e) \qquad \text{eq. 25}$$

$$S_4=S(D+d+e) \qquad \text{eq. 26}$$

The overlay measurement may then be determined as follows:

$$e = \frac{d}{2}\frac{S_3 - S_2}{S_4 - S_3} \qquad \text{eq. 27}$$

From equation 22 using $d_1=d_2=d$, linearity is:

$$L = \frac{S_1 - S_2}{S_4 - S_3} - 1 \qquad \text{eq. 28}$$

All pads are included in the linearity test. Thus, the linearity test in equation 28 is performed on two x intervals $[x_2, x_1]$ and $[x_3, x_4]$ while the measurement of the overlay error e in equation 27 is extracted over the interval $[x_2, x_3]$. The range condition is that the intervals $[x_2, x_1]$ and $[x_3, x_4]$ overlap when:

$$x_1 \geq x_3 : e \leq \frac{d}{2} \qquad \text{eq. 29}$$

$$x_4 \geq x_2 : e \geq -\frac{d}{2} \qquad \text{eq. 30}$$

$$-\frac{d}{2} \leq e \leq \frac{d}{2} \qquad \text{eq. 31}$$

eDBO Target B

In another embodiment of the eDBO target 100 (or eDBO target 100'), the alignment pads (P1, P2, P3, P4) include the following respective shifts: $x_1=-D-2d+e$, $x_2=-D+e$, $x_3=+D+e$, $x_4=+D+d+e$. The resulting signals $S_i(x_i)$ from each alignment pad $P_i$ are functions as follows:

$$S_1 = S(-D-2d+e) = S(D+2d-e) \qquad \text{eq. 32}$$

$$S_2 = S(-D+e) = S(D-e) \qquad \text{eq. 33}$$

$$S_3 = S(D+e) \qquad \text{eq. 34}$$

$$S_4 = S(D+d+e) \qquad \text{eq. 35}$$

The overlay measurement may then be determined as follows:

$$e = \frac{d}{2} \frac{S_3 - S_2}{S_4 - S_3} \qquad \text{eq. 36}$$

From equation 22, using $d_1=2d$, $d_2=d$, linearity is:

$$L = \left(\frac{1}{2}\right)\left(\frac{S_1 - S_2}{S_4 - S_3}\right) - 1 \qquad \text{eq. 37}$$

Data from all four pads are included in the linearity test. The range condition is that the two intervals $[x_2, x_1]$ and $[x_3, x_4]$ overlap as follows:

$$x_1 \geq x_3 : e \leq d \qquad \text{eq. 38}$$

$$x_4 \geq x_2 : e \geq -\frac{d}{2} \qquad \text{eq. 39}$$

$$-\frac{d}{2} \leq e \leq d \qquad \text{eq. 40}$$

It should be noted that the asymmetric range condition (equation 40) is not very helpful as the overlay error e is expect to be distributed symmetrically around e=0. Accordingly, the practical range of e for this embodiment is still $-d/2 \leq e \leq d/2$.

eDBO Target C

In yet another embodiment of the eDBO target 100 (or eDBO target 100'), the alignment pads (P1, P2, P3, P4) include the following respective shifts: $x_1=-D-d+e$, $x_2=+D+e$, $x_3=+D+d+e$, $x_4=+D+2d+e$. The resulting signals $S_i(x_i)$ from each alignment pad $P_i$ are functions as follows:

$$S_1 = S(-D-d+e) = S(D+d-e) \qquad \text{eq. 41}$$

$$S_2 = S(D+e) \qquad \text{eq. 42}$$

$$S_3 = S(D+d+e) \qquad \text{eq. 43}$$

$$S_4 = S(D+2d+e) \qquad \text{eq. 44}$$

The overlay measurement may then be determined as follows:

$$e = \frac{d}{2} \frac{S_3 - S_1}{S_3 - S_2} \qquad \text{eq. 45}$$

The linearity test uses pads P2 to P3 and P3 to P4, with the same increase of shift in each pair so that $d_1=d_2=d$. Applying the approach of equation 22, linearity is:

$$L = \frac{S_3 - S_2}{S_4 - S_3} - 1 = \frac{A(D)kd + \alpha_3 - \alpha_2 + B_3 - B_2}{A(D)kd + \alpha_4 - \alpha_3 + B_4 - B_3} \qquad \text{eq. 46}$$

In this embodiment, alignment pad P1 is not included in the linearity test. Accordingly, the range condition is as follows:

$$x_1 \geq x_1 : e \leq d \qquad \text{eq. 47}$$

$$x_4 \geq x_1 : e \geq -\frac{d}{2} \qquad \text{eq. 48}$$

$$-\frac{d}{2} \leq e \leq \frac{d}{2} \qquad \text{eq. 49}$$

Testing the Assumption S(x)=S(−x)

It is not possible to directly test the assumption that $S(x)=S(-x)$, because the overlay error e is unknown. The derivation of L in equation 22 shows that it will be non-zero if the $S(x) \neq S(-x)$, and so includes a test for signal symmetry.

The linearity checks for eDBO targets A and B, described above, will not identify a constant error, $S(-x)=a+S(x)$. For example, for eDBO target A:

$$\frac{S_3 - S_2}{S_4 - S_3} = \frac{a}{kdS(D)} + \frac{2e}{d}. \qquad \text{eq. 50}$$

Thus, the overly error e measurement is in error by:

$$\delta e = \int \frac{a}{2kS(D, \lambda)} f(\lambda) d\lambda. \qquad \text{eq. 51}$$

Where $f(\lambda)$ is the intensity of the incident light as a function of wavelength, $\lambda$.

If the assumption $S(x)=S(-x)$ fails in a more complicated way then the constant error described above, the collected data will fail the linearity test, or will fail for at least many wavelengths. In cases such as this, the linearity test advantageously prevents a measurement being made improperly.

Figure 2:
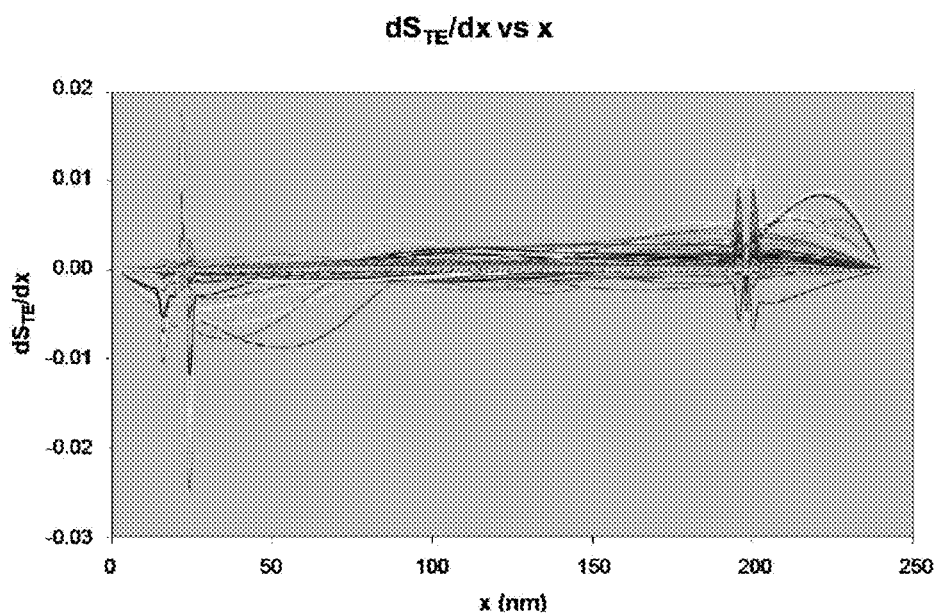
FIG. 2 shows a graph of dS/dx vs total offset (x) for different wavelengths (λ).

The eDBO linearity method relies on dS/dx being constant, where S is the signal from each pad, where all pads differ only in the total shift x, so S is a function of x. FIG. 2 shows a graph of dS/dx vs x, where dS/dx is measured in TE (transverse electric) and x (in nanometers) is the total shift between the two gratings in the eDBO target, including the deliberate shifts (D and d) and the overlay error e to be measured. The different curves in FIG. 2 represent different wavelengths. As can be seen, there are regions where dS/dx is constant (near x=125) and regions where dS/dx is not constant (x=20, x=200).

Figure 3:
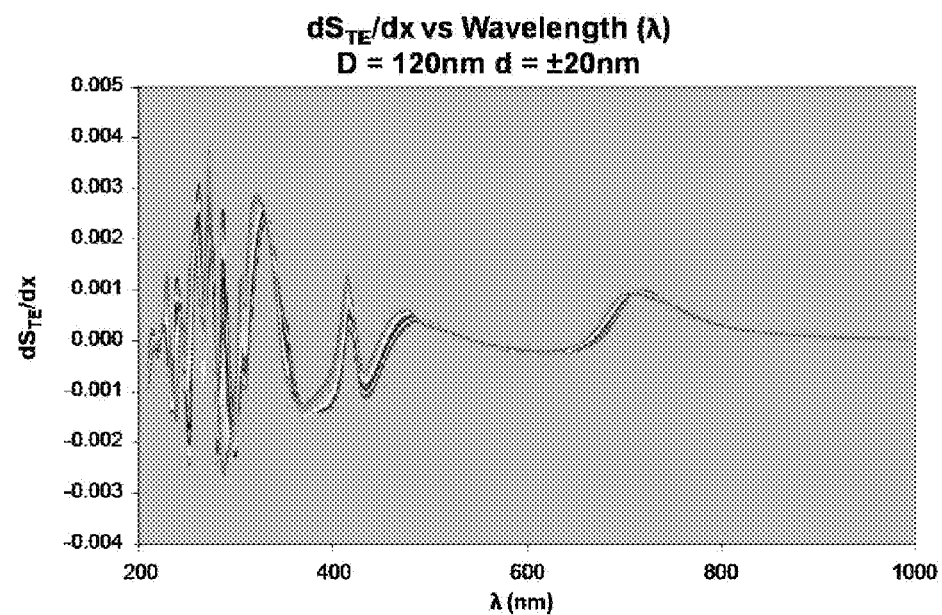
FIG. 3 shows a graph of dS/dx vs wavelength (λ) for different total offset values.

FIG. 3 shows a graph of dS/dx vs wavelength ($\lambda$) for different x values illustrated by the different curves. It is desirable to operate in a region where the curves overlap, e.g., above 425 nm in this example.

Use of the above described eDBO targets, makes it possible to test that dS/dx is constant (e.g., less than a predetermined threshold) over a range of x in the eDBO target (e.g., x varies by 2d+2e between the 4 pads in the DBO target B), for wavelengths in the eDBO measurement. The analysis can then be used to modify the wavelength range used to measure the overlay error to meet conditions of linearity and hence improve the quality of the measurement. If desired, the test for dS/dx, if available either by simulation or from experimental data, may be used in addition to or as an alternative to the linearity check described above.

The linearity check is performed in each overlay measurement. The criterion |L|<=threshold, where L is the dimensionless linearity factor, is used to check if the diffraction signal has linear response to the overlay error. For each wavelength, the condition is checked. The wavelengths that satisfy the condition are used to calculate overlay error e.

Figure 4:
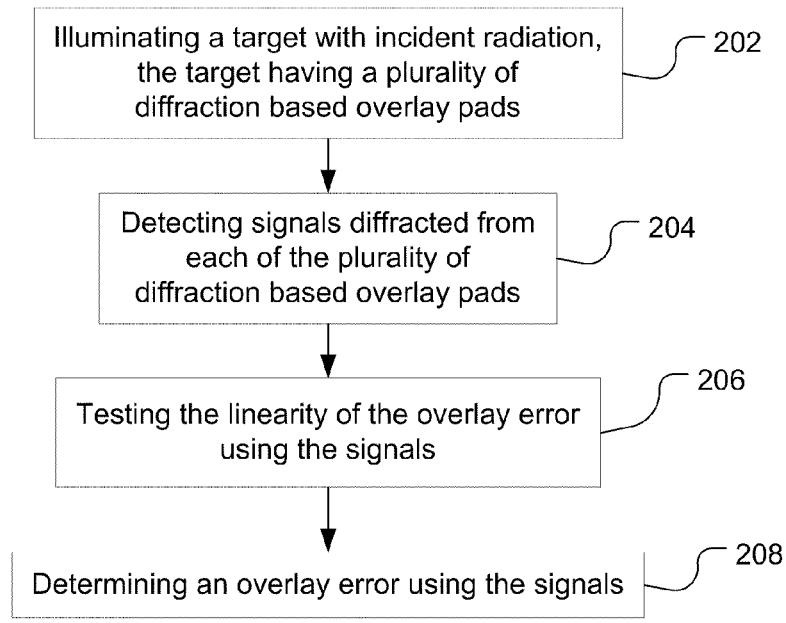
FIG. 4 is a flow chart illustrating measuring overlay error based on eDBO with a linearity check.

FIG. 4 is a flow chart illustrating measuring overlay error based on eDBO with a linearity check. As illustrated, a target with a plurality of diffraction based alignment pads, such as that shown in FIGS. 1A and 1B and as described as eDBO targets A, B, or C, is illuminated with incident radiation (202). The incident radiation may include a plurality of wavelengths. Signals diffracted from each of the plurality of diffraction based alignment pads are detected, after the incident radiation interacts with the pads (204). The overlay error e is tested for linearity using the signals (206). For example, equations 28, 37, or 46 or mathematical equivalents thereto may be used to test linearity. Additionally, or alternatively, linearity may be tested by determining for each signal S diffracted from each of the alignment pads whether a change in the signal S is less than a threshold as a value the overlay error x changes, e.g., dS/dx as described above. The linearity is tested for each wavelength if the incident radiation has a plurality of wavelengths. If the signal is found to be sufficiently linear, an eDBO measurement of the overlay error is determined using the detected signals (208), as described, e.g., in equations 27, 36, and 45. If the incident radiation has a plurality of wavelengths, the linear wavelengths in the signals are used to determine the overlay error. It should be understood that eDBO targets other than those described as eDBO targets A, B, or C may be used and that other types of eDBO measurements may be performed. Moreover, it should be understood that equations 27, 36, and 45 are simply exemplary descriptions of determining overlay error e and that mathematical equivalent ways of determining overlay error are contemplated herein.

Figure 5:
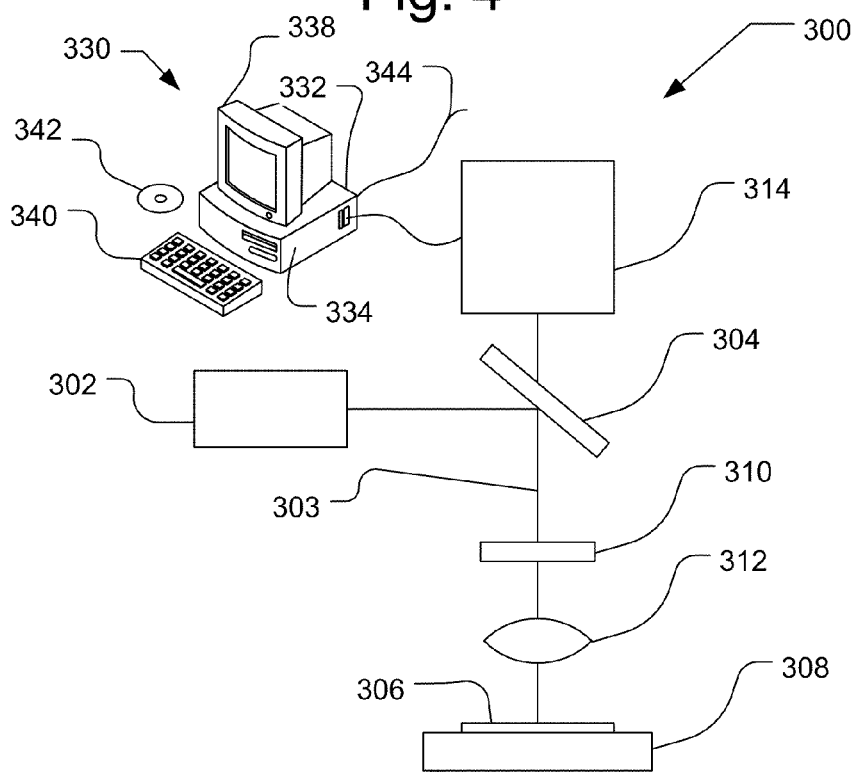
FIG. 5 illustrates a spectrometer that may be used to measure target and perform a linearity check.

The measurement of the spectra from the alignment pads may be performed using a reflectometer, ellipsometer, scatterometer or any other appropriate instrument. By way of example, FIG. 5 illustrates a normal incidence polarized reflectance spectrometer 300 that may be used to measure target 100 and to check linearity. Spectrometer 300 is discussed in detail in the U.S. Pat. No. 7,115,858, which is incorporated herein by reference.

As shown in FIG. 5, spectrometer 300 is similar to a reflectometer, which is well known in the art. Spectrometer 300 includes a polychromatic light source 302 that generates a light beam that is partially reflected by beam splitter 304 along the optical axis 303. The light beam is directed towards a sample 306 having an overlay pattern, such as eDBO target 100 (or 100'), to be measured. Sample 306 may be, e.g., a semiconductor wafer or flat panel display or any other substrate, and is supported by a stage 308, which may be a polar coordinate, i.e., R-$\theta$, stage or an x-y translation stage. Spectrometer 300 includes a rotatable polarizer 310 and a lens 312 (or series of lenses) to polarize and focus the light beam onto the sample 306 at normal incidence. The beam is reflected off sample 306 and the reflected light is transmitted through lens 312 and polarizer 310. A portion of the reflected light is transmitted through beam splitter 304 and is received by a spectrophotometer 314. Spectrophotometer 314 is coupled to computer 330, which analyzes the data provided by spectrophotometer 314. Computer 330 includes a processor 332 with memory 334, as well as a user interface including e.g., a display 338 and input devices 340. A non-transitory computer-usable medium 342 having computer-readable program code embodied may be used by the computer 330 for causing the processor to control the spectrometer 300 and to perform the functions including the analysis described herein. The data structures and software code for automatically implementing one or more acts described in this detailed description can be implemented by one of ordinary skill in the art in light of the present disclosure and stored, e.g., on a computer readable storage medium 342, which may be any device or medium that can store code and/or data for use by a computer system such as processor 332. The non-transitory computer-usable medium 342 may be, but is not limited to, magnetic and optical storage devices such as disk drives, magnetic tape, compact discs, and DVDs (digital versatile discs or digital video discs). A communication port 344 may also be used to receive instructions that are used to program the computer 330 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Although the present invention is illustrated in connection with specific embodiments for instructional purposes, the present invention is not limited thereto. Various adaptations and modifications may be made without departing from the scope of the invention. For example, the target may have different number of pads and each pad may have different value of D and d and may be arranged differently from the targets disclosed here. Therefore, the spirit and scope of the appended claims should not be limited to the foregoing description.

What is claimed is:

1. A method comprising:
   illuminating a target with incident radiation, the target having a plurality of diffraction-based alignment pads;

detecting signals diffracted from each of the plurality of diffraction-based alignment pads after the incident radiation interacts with the plurality of diffraction-based alignment pads;

testing a linearity of an overlay error using the signals without using signals from other targets by determining if the signals have a linear response to the overlay error, wherein determining if the signals have a linear response is based on a ratio of a signal difference between a first pair of diffraction-based alignment pads and a signal difference between a second pair of diffraction-based alignment pads that is different than the first pair of diffraction-based alignment pads; and determining an empirical diffraction-based overlay measurement of the overlay error using the signals when the signals have the linear response to the overlay error.

2. The method of claim 1, wherein the signals used for testing the linearity of the overlay error is a same set of signals as used to determine the overlay error.

3. The method of claim 1, wherein the signals used for testing the linearity of the overlay error is a different set of signals as used to determine the overlay error.

4. The method of claim 1, wherein testing the linearity of the overlay error comprises comparing a difference between different pairs of signals.

5. The method of claim 4, wherein the difference between different pairs of signals is compared to a threshold to determine if the signals have a linear response to the overlay error.

6. The method of claim 1, wherein the incident radiation comprises a plurality of wavelengths and wherein testing the linearity of the overlay error is performed for the plurality of wavelengths.

7. The method of claim 6, wherein determining the empirical diffraction-based overlay measurement of the overlay error uses only wavelengths in the signals having a linear response to the overlay error.

8. The method of claim 6, wherein testing the linearity of the overlay error for the plurality of wavelengths comprises determining for each wavelength in each signal diffracted from each of the plurality of diffraction-based alignment pads whether a change in the signal is less than a threshold as a value the overlay error changes.

9. The method of claim 1, wherein the empirical diffraction-based overlay measurement of the overlay error is determined using the signals including a signal difference between a third pair of diffraction-based alignment pads that is different than the first pair of diffraction-based alignment pads and the second pair of pair of diffraction-based alignment pads.

10. The method of claim 1, further comprising testing for signal symmetry while testing the linearity of the overlay error using the signals.

11. An apparatus for comprising:
a radiation source that produces radiation to be incident on a plurality of diffraction-based overlay alignment pads of a target;
a detector that detects signals diffracted from the plurality of diffraction-based overlay alignment pads after the radiation interacts with the plurality of diffraction-based overlay alignment pads; and
a computer coupled to receive the signals detected by the detector; and
a computer-usable medium having computer-readable program code embodied therein for causing the computer to:
test a linearity of an overlay error using the signals without using signals from other targets by determining if the signals have a linear response to the overlay error, wherein determining if the signals have a linear response is based on a ratio of a signal difference between a first pair of diffraction-based alignment pads and a signal difference between a second pair of diffraction-based alignment pads that is different than the first pair of diffraction-based alignment pads; and
determine an empirical diffraction-based overlay measurement of the overlay error of the target using the signals when the signals have the linear response to the overlay error.

12. The apparatus of claim 11, wherein the signals used to test the linearity of the overlay error is a same set of signals as used to determine the overlay error.

13. The apparatus of claim 11, wherein the signals used to test the linearity of the overlay error is a different set of signals as used to determine the overlay error.

14. The apparatus of claim 11, wherein the computer-readable program code causes the computer to test the linearity of the overlay error by comparing a difference between different pairs of signals.

15. The apparatus of claim 14, wherein the difference between different pairs of signals is compared to a threshold to determine if the signals have the linear response to the overlay error.

16. The apparatus of claim 11, wherein the radiation comprises a plurality of wavelengths and wherein the computer tests the linearity of the overlay error for the plurality of wavelengths.

17. The apparatus of claim 16, wherein the computer-readable program code further causes the computer to determine the empirical diffraction-based overlay measurement of the overlay error using only wavelengths in the signals having a linear response to the overlay error.

18. The apparatus of claim 16, wherein the computer-readable program code further causes the computer to test the linearity of the overlay error by causing the computer to determine for each wavelength in each signal diffracted from each of the plurality of diffraction-based alignment pads whether a change in the signal is less than a threshold as a value the overlay error changes.

19. The apparatus of claim 11, wherein the empirical diffraction-based overlay measurement of the overlay error is determined using the signals including a signal difference between a third pair of diffraction-based alignment pads that is different than the first pair of diffraction-based alignment pads and the second pair of pair of diffraction-based alignment pads.

20. The apparatus of claim 11, wherein the computer-readable program code further causes the computer to test for signal symmetry while testing the linearity of the overlay error using the signals.

* * * * *